(12) United States Patent
Lee et al.

(10) Patent No.: US 10,276,630 B2
(45) Date of Patent: Apr. 30, 2019

(54) LIGHT EMITTING DEVICE AND FABRICATING METHOD THEREOF

(71) Applicant: SAMSUNG DISPLAY CO., LTD., Yongin-si, Gyeonggi-do (KR)

(72) Inventors: Hyun Sup Lee, Yongin-si (KR); Jung Hun Noh, Yongin-si (KR); Sang Hee Jang, Yongin-si (KR); Hyung Il Jeon, Yongin-si (KR); Byung Seok Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 20 days.

(21) Appl. No.: 15/585,559

(22) Filed: May 3, 2017

(65) Prior Publication Data
US 2018/0026074 A1    Jan. 25, 2018

(30) Foreign Application Priority Data

Jul. 21, 2016 (KR) .......................... 10-2016-0092863

(51) Int. Cl.
| | |
|---|---|
| *H01L 21/00* | (2006.01) |
| *H01L 27/15* | (2006.01) |
| *F21S 4/28* | (2016.01) |
| *H01L 33/36* | (2010.01) |
| *H05B 33/08* | (2006.01) |
| *G02F 1/1333* | (2006.01) |

(52) U.S. Cl.
CPC .............. *H01L 27/153* (2013.01); *F21S 4/28* (2016.01); *H01L 33/36* (2013.01); *H05B 33/0803* (2013.01); *G02F 1/133345* (2013.01)

(58) Field of Classification Search
CPC ..... H01L 27/153; H01L 27/156; H01L 33/36; H01L 33/38; H01L 33/0803
See application file for complete search history.

(56) References Cited

U.S. PATENT DOCUMENTS

| | | | |
|---|---|---|---|
| 6,440,761 B1 | 8/2002 | Choi | |
| 8,441,185 B2 * | 5/2013 | Kuwabara | H01L 27/3246 |
| | | | 313/506 |
| 9,112,112 B2 | 8/2015 | Do et al. | |
| 2008/0277678 A1 * | 11/2008 | Li | H01L 33/22 |
| | | | 257/94 |
| 2014/0217457 A1 * | 8/2014 | Cho | H04L 33/20 |
| | | | 257/99 |

FOREIGN PATENT DOCUMENTS

| | | |
|---|---|---|
| KR | 2000-0074609 A | 12/2000 |
| KR | 10-0293431 B1 | 8/2001 |
| KR | 10-1244926 B1 | 3/2013 |

* cited by examiner

*Primary Examiner* — Richard A Booth
(74) *Attorney, Agent, or Firm* — Lee & Morse, P.C.

(57) ABSTRACT

A light emitting device includes a first electrode, an insulating layer, a second electrode, and a bar-type light emitting diode (LED). The insulating layer includes a plurality of protruding parts protruding from the first electrode and at least one hole between the protruding parts. The second electrode on the insulating layer. The bar-type LED is in the at least one hole. The bar-type LED has a first end and a second end in the length direction. One of the first or second ends is connected to the first electrode and the other of the first or second ends is connected to the second electrode.

12 Claims, 14 Drawing Sheets

LIGHT EMITTING DEVICE AND FABRICATING METHOD THEREOF

CROSS-REFERENCE TO RELATED APPLICATION

Korean Patent Application No. 10-2016-0092863, filed on Jul. 21, 2016, and entitled, "Light Emitting Device and Fabricating Method Thereof," is incorporated by reference herein in its entirety.

BACKGROUND

1. Field

One or more embodiments described herein relate to a light emitting device and a method for fabricating a light emitting device.

2. Description of the Related Art

Light emitting diodes (LEDs) are durable, even in poor environmental conditions, and have excellent lifespan and luminance. One type of LED, known as a micro bar-type LED, has a size on a micro or nano scale and includes an inorganic crystal structure, e.g., a structure in which a nitride-based semiconductor is grown.

SUMMARY

In accordance with one or more embodiments, a light emitting device includes a substrate; a first electrode on the substrate; an insulating layer including a plurality of protruding parts protruding from the first electrode and at least one hole between the protruding parts; a second electrode on the insulating layer; and a bar-type LED in the at least one hole, wherein the bar-type LED has a first end and a second end in the length direction and wherein one of the first or second ends is connected to the first electrode and the other of the first or second ends is connected to the second electrode. The length direction of the bar-type LED may be vertical or oblique relative to a surface of the substrate. Each of the protruding parts may have a reverse tapered shape. A height of each of the protruding parts may be equal to or less than a length of the bar-type LED.

The light emitting device may include a plurality of holes between the protruding parts. The holes may be arranged radially. The holes may have a stripe shape. The may be arranged in parallel to each other. A width of each of the holes may be less than the length of the bar-type LED. A shape of the second electrode may be substantially equal to a shape of the insulating layer.

The light emitting device may include an auxiliary electrode between one of the first or second ends and the first electrode or between one of the first or second ends and the second electrode. The first electrode and the second electrode may be at different heights from a top surface of the substrate.

In accordance with one or more other embodiments, a method for fabricating a light emitting device includes forming a first conductive layer on a substrate; forming, on the first conductive layer, an insulating having a hole exposing a portion of the first conductive layer; forming a second conductive layer on the substrate to form first and second electrodes having different heights from a surface of the substrate; applying an electric field between the first and second electrodes; and scattering bar-type LEDs on the substrate. Forming the insulating layer may include forming a negative type photoresist on the first electrode; and exposing and developing the photoresist to pattern the photoresist. Forming the electric field and scattering the bar-type LEDs may be simultaneously performed. The method may include forming a first auxiliary electrode before the scattering of the bar-type LEDs on the substrate. The method may include forming a second auxiliary electrode after scattering the bar-type LEDs on the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
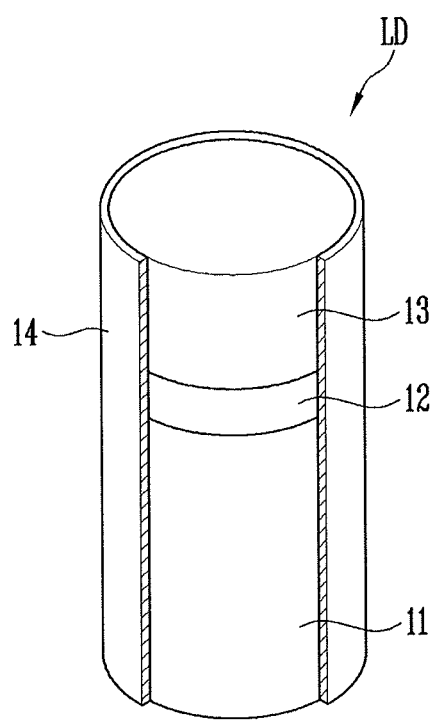
FIG. 1 illustrates an embodiment of a bar-type LED.

Example embodiments will now be described with reference to the accompanying drawings; however, they may be embodied in different forms and should not be construed as limited to the embodiments herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a bar-type LED LD which includes an active layer 12 between first and second conductive semiconductor layers 11 and 13. The bar-type LED LD may have, for example, a stack structure in which the first conductive semiconductor layer 11, the active layer 12, and the second conductive semiconductor layer 13 are sequentially stacked.

The bar-type LED LD has a bar shape extending along one direction. One of the first or second conductive semiconductor layers 11 and 13 is at a first end of the bar-type LED LD and the other of the first or second conductive semiconductor layers 11 and 13 is at a second end of the bar-type LED LD.

The bar-type LED LD has a cylindrical shape in FIG. 1, but may have a polygonal column shape or another shape in another embodiment. The term "bar-type" may include a rod-like shape or bar-like shape having a length greater than a width (e.g., an aspect ratio greater than 1). For example, the length of the bar-type LED LD may be greater than the diameter of the bar-type LED LD.

The bar-type LED LD may have a diameter, width, and/or a length on, for example, micro or nano scale. The size of the bar-type LED LD may be different in another embodiment depending, for example, one or more predetermined conditions of a light emitting device to which the bar-type LED LD is applied.

The first conductive semiconductor layer 11 may include, for example, at least one n-type semiconductor layer. For example, the first conductive semiconductor layer 11 may include at least one of InAlGaN, GaN, AlGaN, InGaN, AlN, or InN. The first conductive semiconductor layer 11 may include a semiconductor layer doped with a first conductive dopant, e.g., Si, Ge, or Sn. The material of the first conductive semiconductor layer 11 may be different in another embodiment.

The active layer 12 is on the first conductive semiconductor layer 11 and may have a single- or multiple-quantum well structure. According to an embodiment, a clad layer doped with a conductive dopant may be formed over and/or under active layer 12. For example, the clad layer may be implemented as an AlGaN layer or InAlGaN layer. In one embodiment, a material such as AlGaN or AlInGaN may also be used for the active layer 12. If an electric field having a predetermined voltage or more is applied to ends of the bar-type LED, the bar-type LED emits light based on a recombination of electron-hole pairs in the active layer 12.

The second conductive semiconductor layer 13 is on the active layer 12 and may include a semiconductor layer different from the first conductive semiconductor layer 11. For example, the second conductive semiconductor layer 13 may include at least on p-type semiconductor layer. The second conductive semiconductor layer 13 may include at least one of InAlGaN, GaN, AlGaN, InGaN, AlN, or InN. The second conductive semiconductor layer 13 may include a semiconductor layer doped with a second conductive dopant such as Mg. The material of the second conductive semiconductor layer 13 may be different in another embodiment.

In one embodiment, the bar-type LED LD may include a phosphor layer, an active layer, a semiconductor layer, and/or an electrode layer formed over and/or under each of the first conductive semiconductor layer 11, the active layer 12, and the second conductive semiconductor layer 13. In addition, the bar-type LED LD may include an insulating film 14. In one embodiment, the insulating film 14 may be omitted or may cover only a portion of the first conductive semiconductor layer 11, the active layer 12, and the second conductive semiconductor layer 13. For example, the insulating film 14 may cover all but ends of the bar-type LED LD, e.g., the ends may be exposed.

A state in which a portion of the insulating film 14 is removed is illustrated in FIG. 1. In one embodiment, the entire side surface of the cylindrical column may be surrounded by the insulating film 14.

The insulating film 14 may surround at least one portion of outer circumferential surfaces of the first conductive semiconductor layer 11, the active layer 12, and/or the second conductive semiconductor layer 13. For example, the insulating film 14 may at least surround the outer circumferential surface of the active layer 12. According to an embodiment, the insulating film 14 may include a transparent insulating material. For example, the insulating film 14 may include at least one of $SiO_2$, $Si_3N_4$, $Al_2O_3$, or $TiO_2$. That is, various materials having insulating properties may be used.

According to an embodiment, the insulating film 14 may include a hydrophobic material or a hydrophobic film made of a hydrophobic material. The hydrophobic material may include, for example, fluorine in order to exhibit hydrophobicity. The hydrophobic material may be applied, for example, in the form of a self-assembled monolayer (SAM) to the bar-type LED LD. The hydrophobic material may include octadecyltrichlorosilane, fluoroalkyltrichlorosilane, or perfluoroalkyltriethoxysilane, to name a few examples. In addition, the hydrophobic material may be a commercialized fluorine-containing material such as Teflon™ or Cytop™ or corresponding material.

When the insulating film 14 is formed, it is possible to prevent the active layer 12 from being short-circuited with the first electrode and/or the second electrode. Further, as the insulating film 14 is formed, it is possible to reduce or minimize surface defects of the bar-type LED LD, thereby improving lifespan and efficiency. When a plurality of bar-type LEDs LD are densely arranged, the insulating film 14 may prevent an undesired short circuit from occurring between the bar-type LEDs LD.

The above-described bar-type LED LD may be used as a light emitting source for various light emitting devices. For example, the bar-type LED LD may be used as a light emitting source for lighting devices or self-luminescent display devices.

Figure 2:
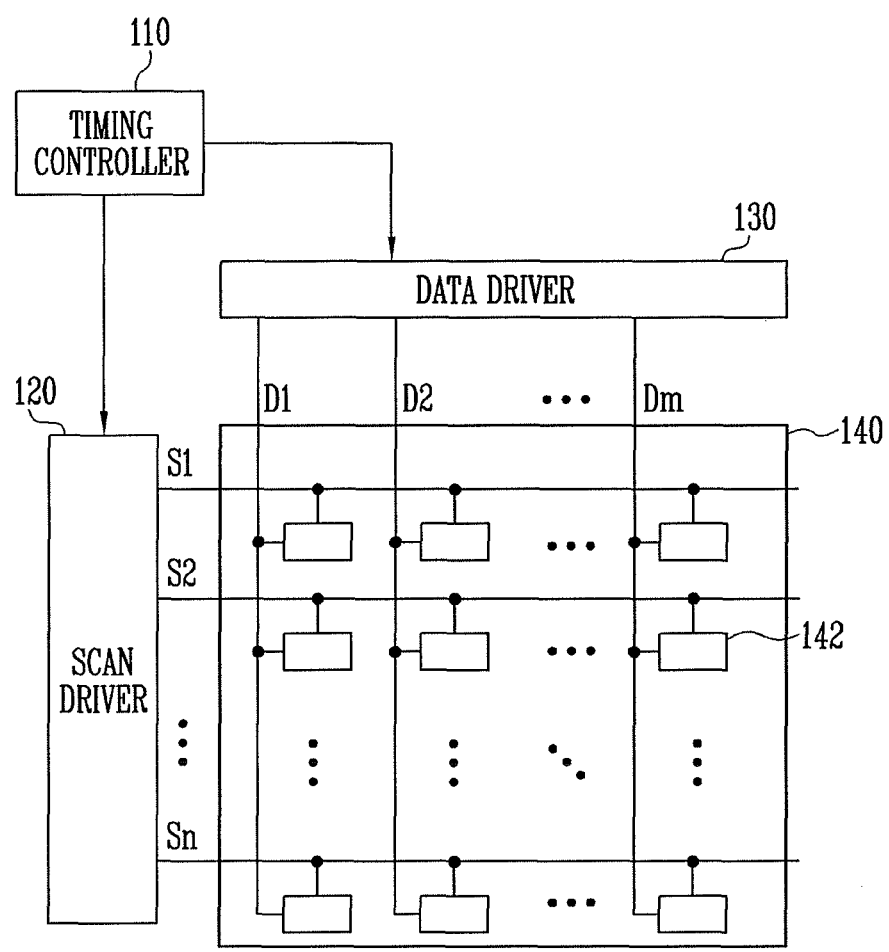
FIG. 2 illustrates an embodiment of a light emitting device.

FIG. 2 illustrates an embodiment of a light emitting device in the form of a light emitting display device. Referring to FIG. 2, the light emitting device includes a timing controller 110, a scan driver 120, a data driver 130, and a light emitting unit 140. When the light emitting device is a light emitting display device, the light emitting unit 140 may correspond to a pixel region of a display panel.

The timing controller 110 receives various control signals and image data from an outside source (e.g., a system for transmitting image data) for driving the light emitting unit 140. The timing controller 110 realigns the received image data and transmits the realigned image data to the data driver 130. The timing controller 110 also generates scan control signals and data control signals for driving the scan and data drivers 120 and 130. The timing controller 110 transmits the generated scan and data control signals to the scan and data drivers 120 and 130.

The scan driver 120 receives a scan control signal from the timing controller 110 and generates a scan signal corresponding to the scan control signal. The scan signal generated by the scan driver 120 is supplied to unit light emitting regions (e.g., pixels) 142 through scan lines S1 to Sn.

The data driver 130 receives a data control signal and image data from the timing controller 110 and generates data signals corresponding to the data control signal and the image data. The data signals are output to data lines D1 to Dm and then input to unit light emitting regions 142 on a horizontal pixel line selected by the scan signal.

The light emitting unit 140 includes a plurality of unit light emitting regions 142 connected to the scan lines S1 to Sn and the data lines D1 to Dm. In one embodiment, the unit light emitting regions 142 may correspond to individual pixels.

Each of the unit light emitting regions 142 may include at least one bar-type LED LD as in FIG. 1. For example, each of the unit light emitting regions 142 may include at least one first color bar-type LED LD, at least one second color bar-type LED LD, and/or a third color bar-type LED LD. The unit light emitting regions 142 selectively emit light, corresponding to a data signal from the data lines D1 to Dm, when a scan signal is supplied from the scan lines S1 to Sn. For example, each of the unit light emitting regions 142 may emit light with a luminance corresponding to the input data signal during each frame period. A unit light emitting region 142 that receives a data signal corresponding to the luminance of black does not emit light during a corresponding frame period, to thereby display black. When the light emitting unit 140 is a pixel unit of an active light emitting display panel, light emitting unit 140 may be driven based on first and second pixel power sources as well as the scan and data signals. The light emitting device of the present embodiment corresponds to a display device. In another embodiment, the light emitting device may be a lighting device.

FIGS. 3A-3E illustrate various embodiments of a unit pixel 142 of a light emitting device, which, for example, may correspond to a pixel of a passive light emitting display panel. For convenience, a jth (j is a natural number) on an ith (i is a natural number) horizontal pixel line is in FIGS. 3A-3E. The pixel in FIGS. 3A-3E may emit for example, red, green, blue, or white light or light of another color.

Figure 3A:
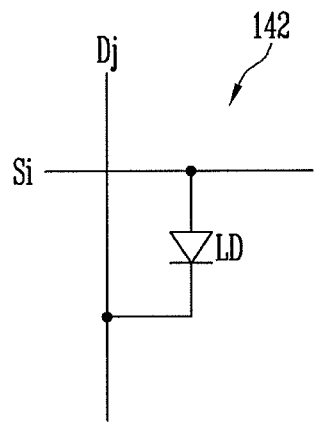
FIGS. 3A-3E illustrate various embodiments of a unit light emitting region.

Referring to FIG. 3A, pixel 142 includes a bar-type LED LD connected between a scan line Si and a data line Dj. A first electrode (e.g., anode electrode) of the bar-type LED LD may be connected to the scan line Si. A second electrode (e.g., cathode electrode) of the bar-type LED LD may be connected to the data line Dj. When a voltage equal to or greater than a threshold voltage is applied between the first electrode and the second electrode, the bar-type LED LD emits light with a luminance corresponding to the magnitude of the applied voltage. A voltage of a scan signal applied to the scan line Si and/or a data signal applied to the data line Dj may be adjusted, to thereby control light emission of the pixel 142.

Figure 3B:
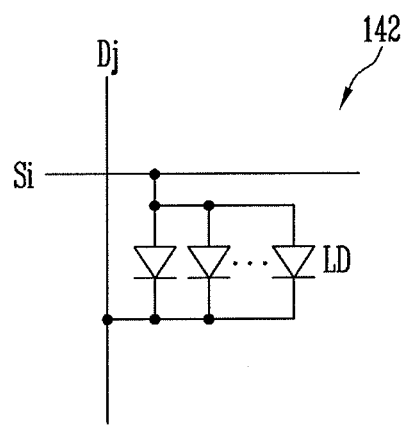

Referring to FIG. 3B, pixel 142 may include at least two bar-type LEDs LD connected in parallel. The luminance of the pixel 142 may correspond to the sum of brightnesses of the LEDs LD of the pixel 142. When the pixel 142 includes a relatively large number of bar-type LEDs LD, the pixel 142 may operate to emit light even when one or more of the bar-type LEDs LD are defective.

Figure 3C:
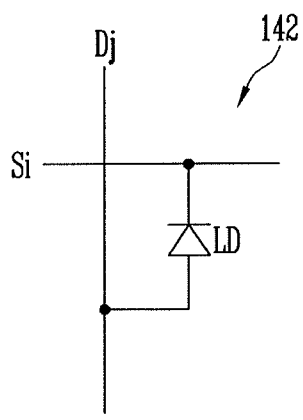

Referring to FIG. 3C, the connecting direction of the bar-type LEDs LD in the pixel 142 is different. For example, a first electrode (anode electrode) of the bar-type LED LD may be connected to the data line Dj, and a second electrode (cathode electrode) of the bar-type LED nLED may be connected to the scan line Si. The direction of a voltage applied between the scan line Si and the data line Dj in FIG. 3A and the direction of a voltage applied between the scan line Si and the data line Dj in FIG. 3C may be opposite to each other.

Figure 3D:
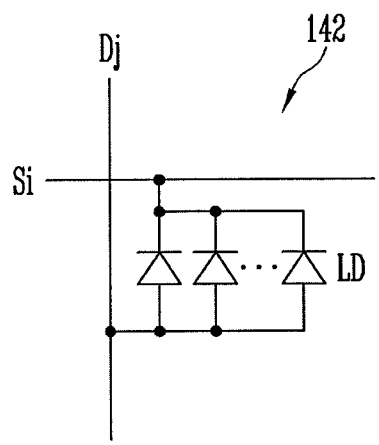

Referring to FIG. 3D, pixel 142 may include at least two bar-type LEDs LD connected in parallel.

Figure 3E:
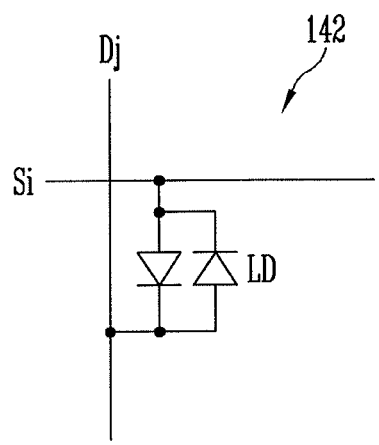

Referring to FIG. 3E, pixel 142 may include a plurality of bar-type LEDs LD connected in different directions. For example, pixel 142 may include at least one bar-type LED LD having a first electrode (anode electrode) connected to the scan line Si and a second electrode (cathode electrode) connected to the data line Dj, and at least one bar-type LED LD having a first electrode (anode electrode) connected to the data line Dj and a second electrode (cathode electrode) connected to the san line Si.

The pixel 142 of FIG. 3E may be DC driven or AC driven. When the pixel 142 of FIG. 3E is DC driven, forward-connected LEDs LD may emit light and reverse-connected LEDs LD may not emit light. When the pixel 142 of FIG. 3E is AC driven, forward-connected LEDs LD emit light according to the direction of an applied voltage. For example, when the pixel 142 of FIG. 3E is AC driven, the bar-type LEDs LD in the pixel 142 may alternately emit light according to the direction of the applied voltage.

Figure 4A:
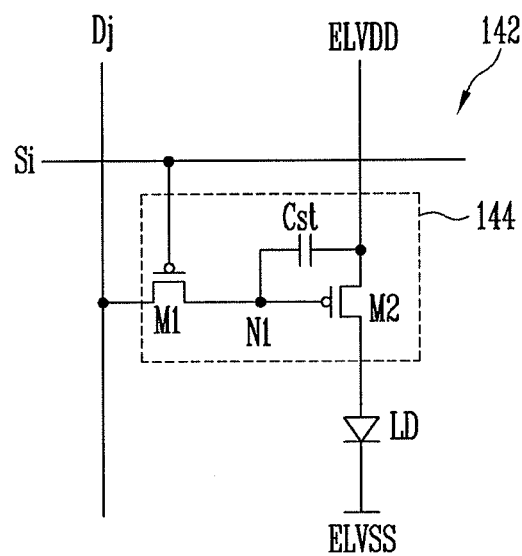
FIGS. 4A-4C illustrate various embodiments of pixel circuits.
Figure 4B:
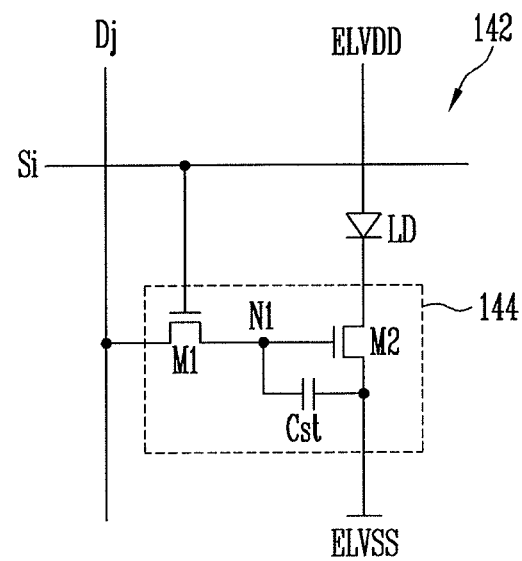
Figure 4C:
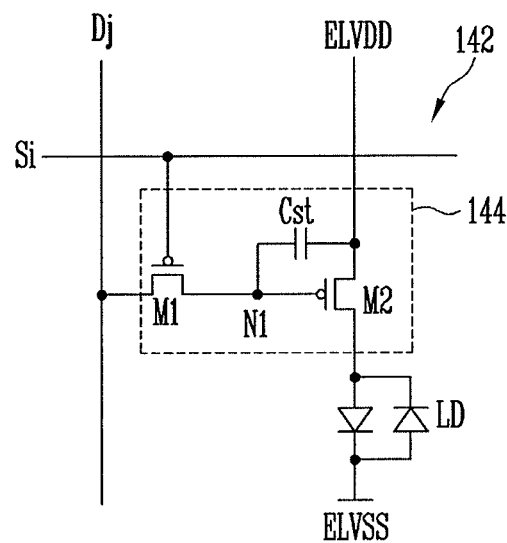

FIGS. 4A-4C illustrate various embodiments of a pixel circuit 144 of a pixel 142 corresponding to a unit light emitting region of a light emitting device, which, for example, may be a pixel of an active light emitting display panel.

Referring to FIG. 4A, pixel 142 includes at least one bar-type LED LD and a pixel circuit 144. A first electrode (e.g., an anode electrode) of the bar-type LED LD is connected to a first pixel power source ELVDD via the pixel circuit 144. A second electrode (e.g., a cathode electrode) of the bar-type LED LD is connected to a second pixel power source ELVSS. The first pixel power source ELVDD and the second pixel power source ELVSS may have different potentials. For example, the second pixel power source ELVSS may have a potential lower by a threshold voltage or more of the bar-type LED nLED than the first pixel power source ELVDD. Each of the bar-type LEDs nLED emits light with a luminance corresponding to a driving current controlled by the pixel circuit 144. Only one bar-type LED LD is in the pixel 142 of FIG. 4A. In another embodiment, pixel 142 may include a plurality of bar-type LEDs LD connected in parallel.

According to an embodiment of the present disclosure, the pixel circuit 144 may include first and second transistors M1 and M2 and a storage capacitor Cst. The first transistor (switching transistor) M1 has a first electrode connected to a data line Dj and a second electrode connected to a first node N1. The first and second electrodes may be source and drain electrodes. A gate electrode of the first transistor M1 is connected to a scan line Si. The first transistor M1 is turned on when a scan signal having a predetermined voltage (e.g., a low voltage) is supplied from the scan line Si. The first transistor passes a data signal from the data line Dj to the first node N1. The data signal transmitted to the first node N1 is charged in the storage capacitor Cst.

The second transistor (driving transistor) M2 has a first electrode connected to the first pixel power source ELVDD and a second electrode connected to the first electrode of the bar-type LED LD. A gate electrode of the second transistor M2 is connected to the first node N1. The second transistor M2 controls the amount of driving current supplied to the bar-type LED LD based on a voltage of the first node N1.

The storage capacitor Cst has a first electrode connected to the first pixel power source ELVDD and a second electrode connected to the first node N1. The storage capacitor Cst charges a voltage corresponding to the data signal supplied to the first node N1 and maintains the charged voltage until a data signal of a next frame is supplied.

The pixel circuit 144 has a relatively simple structure, but may have a different structure in another embodiment. For example, the pixel circuit 144 may include at least one transistor element such as a transistor element for compensating for a threshold voltage of the second transistor M2, a transistor element for initializing the first node N1, and/or a transistor element for controlling a light emission time, or other circuit elements such as a boosting capacitor for boosting the voltage of the first node N1.

The transistors (e.g., the first and second transistors M1 and M2) in pixel circuit 144 in FIG. 4A are p-type transistors. In another embodiment, at least one of the transistors M1 or M2 in the pixel circuit 144 may be an n-type transistor.

Referring to FIG. 4B, the first and second transistors M1 and M2 are n-type transistors. The configuration or operation of a pixel circuit 144 in FIG. 4B is similar to the pixel circuit 144 in FIG. 4A, except the connecting positions of some components are changed due to the different transistor type.

Referring to FIG. 4C, pixel 142 may include a plurality of bar-type LEDs LD connected in different directions. The pixel 142 may be DC driven or AC driven as described in FIG. 3E.

Figure 5:
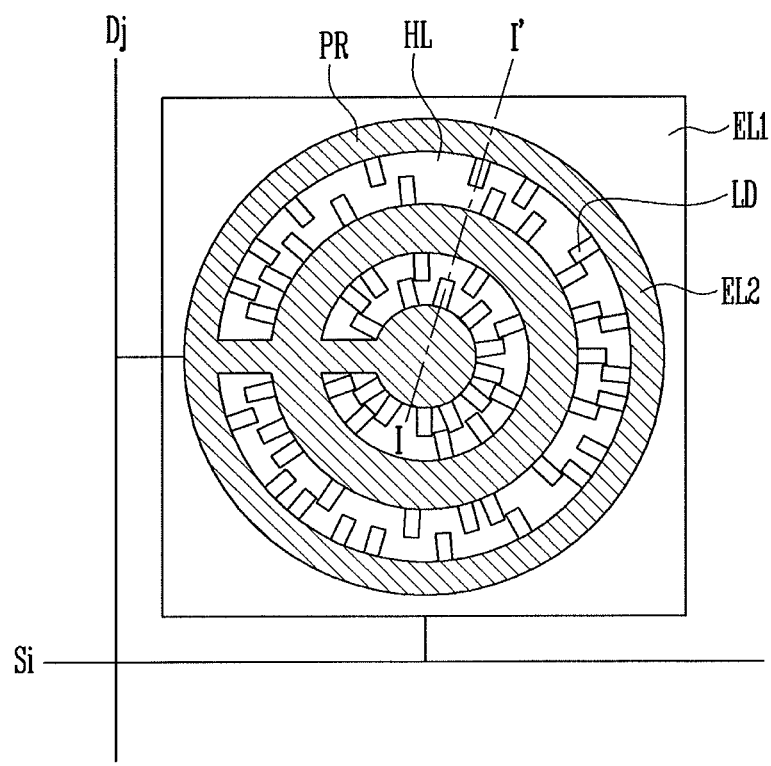
FIG. 5 illustrates another embodiment of a unit light emitting region.
Figure 6:
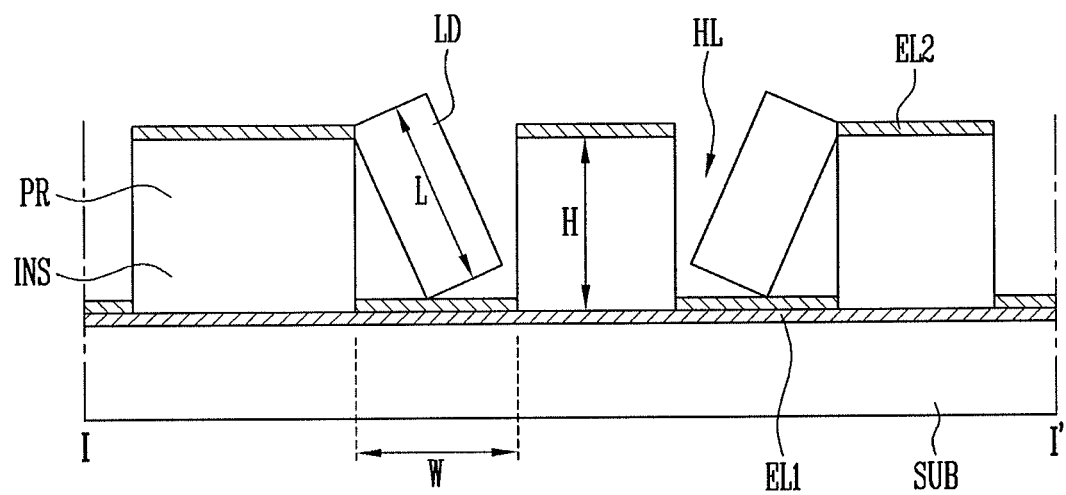
FIG. 6 illustrates a view along section line I-I' in FIG. 5.

FIG. 5 illustrates another embodiment of a unit light emitting region of a light emitting device. FIG. 6 is a sectional view taken along line I-I' in FIG. 5. In FIG. 5, the pixel in FIG. 3B is shown as an example. The may have a passive matrix structure applied to a light emitting display panel. The bar-type LED LD may be applied to the above-described pixel having the passive matrix structure. In another embodiment, the bar-type LED LD may be applied to a pixel having an active matrix structure.

Referring to FIGS. 5 and 6, the light emitting device includes a substrate SUB, a first electrode EL1 on the substrate SUB, an insulating layer INS on the first electrode EL1, the insulating layer INS having protruding parts PR and holes HL, a second electrode EL2 on the insulating layer INS, and bar-type LEDs LD in the holes HL.

The substrate SUB may have, for example, various plate or other shapes. The substrate SUB may have an approximately quadrangular shape, e.g., a rectangular shape. In one embodiment, the substrate SUB may have a closed-shape polygon including linear sides, a circle, an ellipse, etc., with curved sides, or a semicircle, a semi-ellipse, etc., with linear and curved sides.

According to an embodiment, when the substrate SUB has linear sides, at least one portion of corners of each of the shapes may be formed in a curve. For example, when the substrate SUB has a rectangular shape, a portion at which adjacent linear sides meet each other may be replaced with a curve having a predetermined curvature. For example, a vertex portion of the rectangular shape may be formed with a curved side having adjacent ends respectively connected to adjacent linear sides. The curved side has a predetermined curvature. The curvature may be different in another embodiment depending, for example, on a starting position of the curve, a length of the curve, etc.

The substrate SUB may include an insulative material such as glass or resin. In one embodiment, the substrate SUB may include a material having flexibility and, for example, may be bendable or foldable. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The material of the substrate SUB may be different in another embodiment, and, for example, may include a fiber-reinforced plastic (FRP), etc. Also, the substrate SUB may have a single-layered structure or a multi-layered structure.

The first electrode EL1 is on the substrate SUB. The first electrode EL1 is illustrated to be directly formed on the substrate SUB, but may be indirectly connected in another embodiment. Components for allowing the light emitting device to be driven in a passive matrix manner or an active matrix manner may be further provided between the first electrode EL1 and the substrate SUB. For example, when the light emitting device is driven in the active matrix manner, signal lines, an additional insulating layer, and/or a thin film transistor may be provided between the first electrode EL1 and the substrate SUB. The signal lines may include, for example, scan and data lines. The thin film transistor is connected to the signal lines and may include a gate electrode, an active pattern, a source electrode, and a drain electrode. The drain electrode may be connected to the first electrode EL1, and a signal from the data line may be applied to the first electrode EL1 through the thin film transistor. A different number, structure, or shape of the signal lines, insulating layer, and/or thin film transistor may be provided in another embodiment.

The first electrode EL1 includes a conductive material, e.g., a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as PEDOT, and the like. The first electrode EL1 may be formed to have a single-layered structure or a multi-layered structure, a stacked configuration of two or more materials among metals, alloys, conductive oxides, and/or conductive polymers.

The first electrode EL1 may include a lower electrode of a first metal and an upper electrode of a second metal. The lower electrode may cover a front surface of the substrate SUB. The upper electrode is not in a region in which the insulating layer INS is formed and may be in a region in which the insulating layer INS is not formed.

The insulating layer INS is provided on the first electrode EL1. The insulating layer INS includes a plurality of protruding parts PR protruding the first electrode EL1 and holes HL between the protruding parts PR. In an embodiment, the height H of each of the protruding parts PR may correspond to the length of the bar-type LED LD. For example, the height H of each protruding part PR may be substantially equal to or slightly less than the length of the bar-type LED LD.

The protruding parts PR may have various shapes when viewed on a plane. In an embodiment, the protruding parts PR may have be in the form of concentric circles of different diameters. The concentric circles may be connected to each other. Each of the protruding parts PR may be have a rectangular shape when viewed in cross-section.

At least one hole HL may be provided is between adjacent protruding parts PR. In an embodiment, a plurality of holes HL may be between adjacent ones of the protruding parts PR. In one embodiment, the width of each hole HL may be less than the length L of the bar-type LED LD, in order to allow the bar-type LED LD to not lie in a direction parallel to the top surface of the substrate SUB within the width of each of the holes HL.

The insulating layer INS may be an organic insulating layer made of an organic material. The organic material may have photosensitivity. For example, the organic material may include a polymer of a monomer including, for example, an acrylate group, a methacrylate group, an epoxy group, an oxetane group, a vinyl-ether group, or a styrene group.

The second electrode EL2 is on the insulating layer INS. In one embodiment, the second electrode EL2 may only be provided on the insulating layer INS. The shape of the second electrode EL2 on a plane may be substantially equal to that of the insulating layer INS. The second electrode EL2 is also made of a conductive material, e.g., a metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), a conductive polymer such as PEDOT. The second electrode EL2 may have a single-layered structure or a multi-layered structure having a stacked configuration of two or more of metals, alloys, conductive oxides, or conductive polymers.

The first electrode EL1 and the second electrode EL2 are spaced apart from each other. In addition, the first electrode EL1 and the second electrode EL2 are at different heights from the top surface of the substrate SUB. The shortest distance from the first electrode EL1 to the second electrode EL2 is determined corresponding to the length of the bar-type LED LD. For example, the distance from the first electrode EL1 to the second electrode EL2 may be substantially equal to or slightly less than the length of the bar-type LED LD. The difference in height between the first electrode EL1 and the second electrode EL2 may be set, for example, so that the area of the bar-type LED LD contacting the first electrode EL1 and second electrode EL2 is as wide as possible.

In an embodiment, the first electrode EL1 may be connected to a first electrode line and the second electrode EL2 may be connected to a second electrode line, in order to receive a predetermined power source or signal. For example, in a passive light emitting device, the first electrode EL1 may be connected to the scan line Si to receive a scan signal, and the second electrode EL2 may be connected to the data line Dj to receive a data signal. According to an embodiment, in an active light emitting device, at least one of the first electrode EL1 and the second electrode EL2 may be connected to the pixel circuit 144 as disclosed in FIGS. 3A-3E and FIGS. 4A-4C.

A plurality of bar-type LED LD may be provided in the holes HL. The bar-type LED LD may be provided to stand vertically or obliquely relative to the top surface of the substrate SUB. For example, in the bar-type LED LD, if it is assumed that a line that passes through the center of the bar-type LED LD and is parallel to the extending direction of the bar-type LED LD is an axis, the axis is vertical or oblique to the top surface of the substrate SUB. As a result, one of first or second ends of the bar-type LED LD contacts the first electrode EL1. The other of the first or second ends contacts the second electrode EL2.

For example, the first conductive semiconductor layer of the bar-type LED LD may contact the first electrode EL1 and the second conductive semiconductor layer of the bar-type LED LD may contact the second electrode EL2. In one embodiment, the second conductive semiconductor layer of the bar-type LED LD may contact the first electrode EL1 and the first conductive semiconductor layer of the bar-type LED LD may contact the second electrode EL2.

Accordingly, the first and second conductive semiconductor layers of the bar-type LED LD may receive a predetermined voltage applied through the first electrode EL1 and the second electrode EL2. If an electric field having a predetermined voltage or more is applied to both ends (e.g., the first end and the second end of the bar-type LED LD), electron-hole pairs recombine in the active layer to cause the bar-type LED LD to emit light. The light is emitted from the bar-type LED LD in the length direction of the bar-type LED LD.

Since the bar-type LED LD is disposed vertically or obliquely relative to the top surface of the substrate SUB, the bar-type LED LD may emit light in a direction vertical or oblique to the top surface of the substrate SUB. Accordingly, light may be emitted in the direction of the top surface of the substrate SUB. Thus, the light emitting device may be employed in a front light emitting display device. For example, when the first electrode EL1 and the second electrode EL2 are made of a transparent conductive material, the light emitting device according to one embodiment may also emit light in the direction of the rear surface of the substrate SUB. In this case, the light emitting device may be used in a rear light emitting display device. In one embodiment, the second electrodes EL2 may be provided in various shapes.

Figure 7:
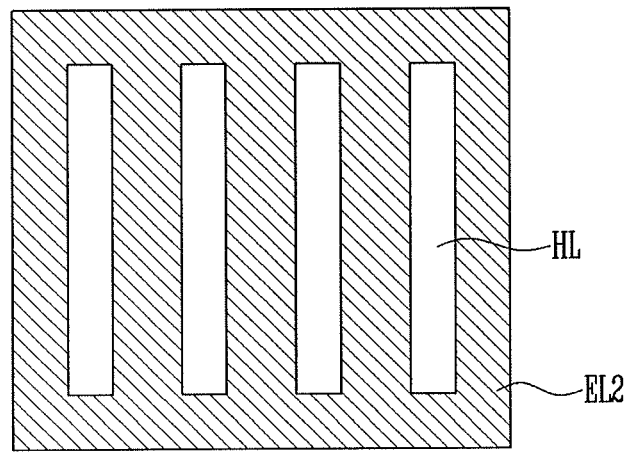
FIGS. 7-9 illustrate various shapes of a second electrode in a light emitting device according to an embodiment.
Figure 8:
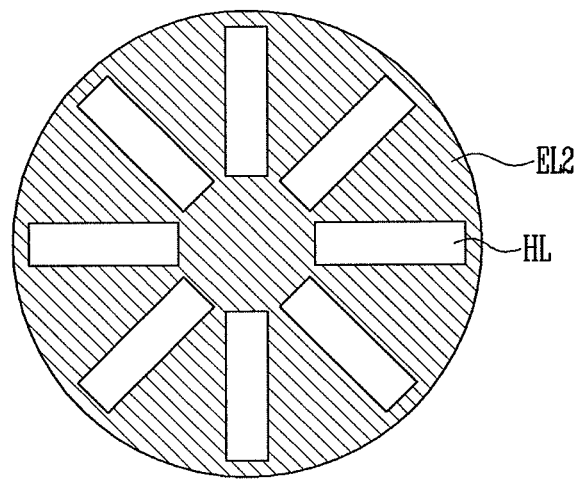
Figure 9:
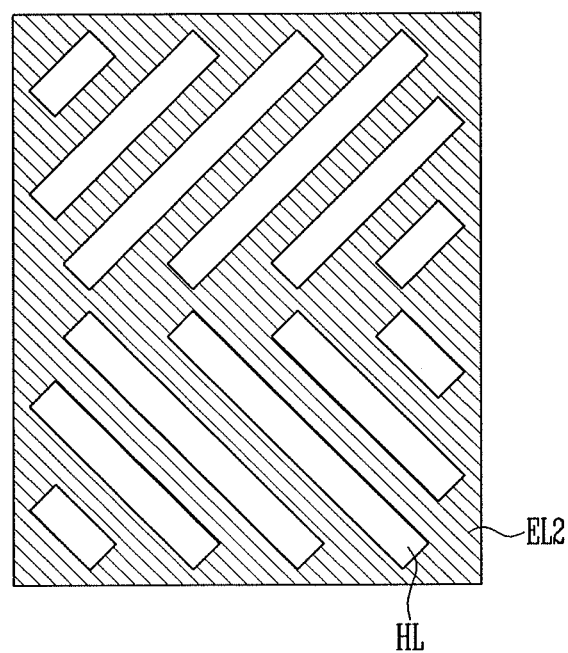

FIGS. 7-9 illustrate various embodiments of the shape of a second electrode in a light emitting device. Referring to FIGS. 7-9, the second electrode EL2 may be in a circular shape or a rectangular shape. In one embodiment, the second electrode EL2 may have other shapes.

A plurality of holes HL may be provided in the second electrode EL2. The holes HL may be substantially provided in an insulating layer. However, since the second electrode EL2 is formed on only the insulating layer, the holes HL are provided in the second electrode EL2 when viewed on a plane.

In an embodiment, the holes HL, in FIG. 7, may be arranged in parallel directions. In an embodiment, the holes HL, in FIG. 8, may be arranged radially with respect to the center of the second electrode EL2. The holes HL, in FIG. 9, may be symmetrical with respect to a predetermined line passing through second electrode EL2.

Figure 10A:
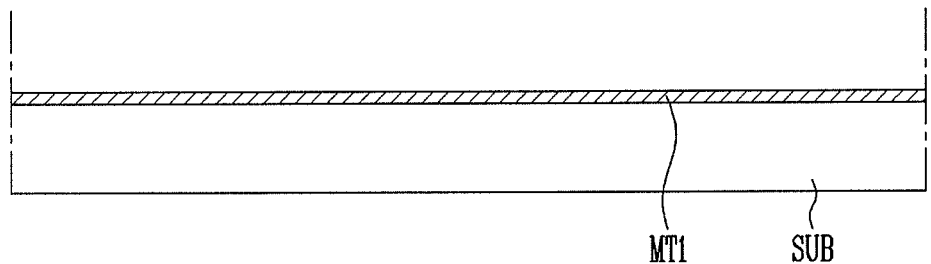
FIGS. 10A-10E illustrate various stages of an embodiment of a method for fabricating the light emitting device in FIGS. 5 and 6.

FIGS. 10A-10E illustrate various stages of an embodiment for fabricating the light emitting device in FIGS. 5 and 6. Referring to FIG. 10A, a first conductive layer MT1 is formed on a substrate SUB. A buffer layer may optionally be formed before the first conductive layer MT1 is formed. In the present embodiment, the first conductive layer MT1 is directly formed on the substrate SUB. In another embodiment, the first conductive layer MT1 may be indirectly formed on the substrate SUB. Components for allowing the light emitting device to be driven in a passive matrix manner or an active matrix manner may be between the first conductive layer MT1 and the substrate SUB. The first conductive layer MT1 may be formed, for example, by coating or depositing the above-described conductive materials.

Figure 10B:
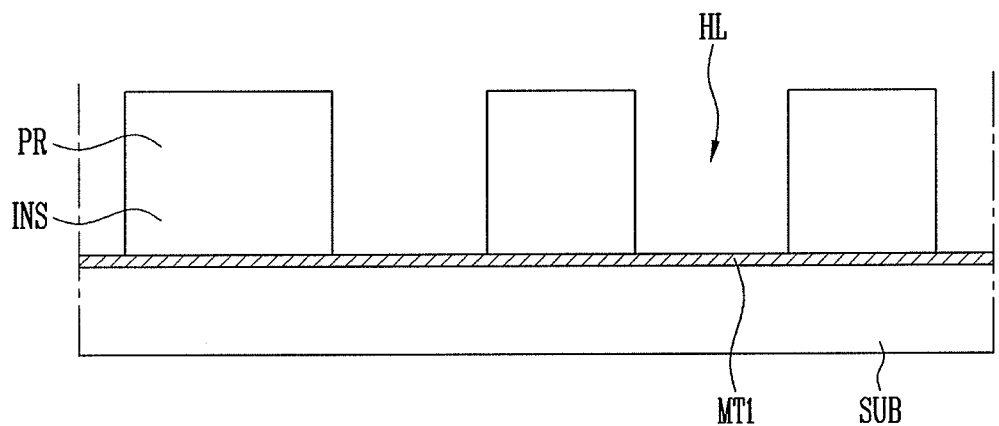

Referring to FIG. 10B, an insulating layer INS having protruding parts PR, and holes HL between the protruding parts PR, is formed on the first conductive layer MT1. The insulating layer INS may be formed, for example, by forming a photosensitive organic layer on the first conductive layer MT1, exposing the photosensitive organic layer using a mask, and then developing the photosensitive organic layer. The photosensitive organic layer may be of a positive type and a negative type.

Figure 10C:
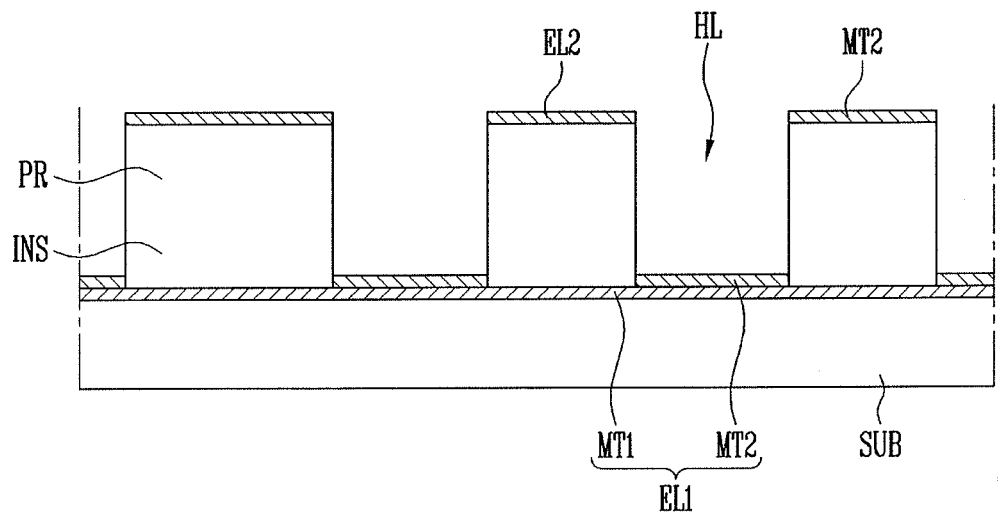

Referring to FIG. 10C, a second conductive layer MT2 is formed on the substrate SUB on which the insulating layer INS is formed. The second conductive layer MT2 may be formed, for example, by coating or depositing the above-described conductive materials. Accordingly, the second conductive layer MT2 is stacked on the first conductive layer MT1 in a region in which the insulating layer INS is not provided. The first conductive layer MT1 and the second conductive layer MT2, in the region in which the insulating layer INS is not provided, become a lower electrode and an upper electrode, respectively, and constitute a first electrode EL1. A second electrode EL2 configured as the second conductive layer MT2 is formed on the insulating layer INS in a region in the insulating layer INS is provided.

Figure 10D:
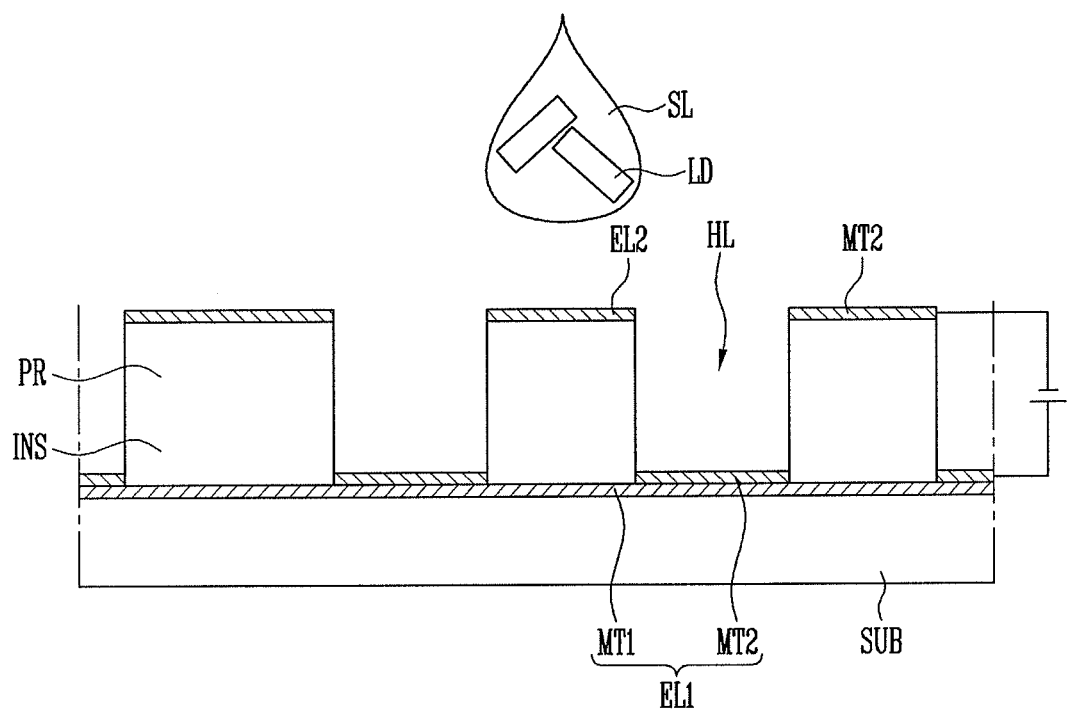

Referring to FIG. 10D, a voltage is applied to the first electrode EL1 and the second electrode EL2. An electric field is formed between the first electrode EL1 and the second electrode EL2. Bar-type LEDs LD are scattered on the substrate SUB in the state in which the electric field is applied between the first electrode EL1 and the second electrode EL2.

An inkjet printing technique is a non-restrictive example of a technique that may be used to inject a bar-type LED LD onto the substrate SUB on which the first and second electrodes EL1 and EL2 are formed. For example, a nozzle is disposed over the corresponding substrate SUB, and a solution SL including a bar-type LED LD is dropped through the nozzle, thereby injecting the bar-type LED LD into a light emitting region. According to an embodiment, the solution SL may have an ink or paste phase. Subsequently, a solvent in the solution SL may be removed. A different technique may be used to inject the bar-type LED LD onto the substrate SUB in another embodiment.

When the bar-type LED LD is injected, self-alignment of the bar-type LED LD is induced because the electric field is formed between the first electrode EL1 and the second electrode EL2. In one embodiment, self-alignment of the bar-type LED LD may be induced as a DC or AC voltage is applied to the first and second electrodes EL1 and EL2. For example, when a voltage is applied to the first and second electrodes EL1 and EL2, dipolarity is induced to the bar-type LED LD by the electric field between the first and second electrodes EL1 and EL2. Accordingly, the bar-type LED LD is self-aligned between the first and second electrodes EL1 and EL2. The difference in height between the first and second electrodes EL1 and EL2 forms an electric field vertical or oblique to the top surface of the substrate SUB, and the bar-type LED LD is self-aligned along the electric field.

In one embodiment, an auxiliary electrode for easily connecting the first electrode EL1 to one of first or second ends of the bar-type LED LD, and/or easily connecting the second electrode EL2 to the other of the first or second ends of the bar-type LED LD, may be further formed. For example, a first auxiliary electrode may be formed between the first electrode EL and one of the first or second ends of the bar-type LED LD. A second auxiliary electrode may be formed between the second electrode EL2 and the other of the first or second ends of the bar-type LED LD. The auxiliary electrodes are used to easily connect the first and second electrodes EL1 and EL2 to the bar-type LED LD. The shape or material of the auxiliary electrodes is not particularly limited. In one embodiment, the first and second auxiliary electrodes may include a conductive material, e.g., a transparent conductive material. The transparent conductive material may include, for example, a conductive oxide such as indium tin oxide (ITO), indium zinc oxide (IZO), zinc oxide (ZnO), or indium tin zinc oxide (ITZO), or a conductive polymer such as PEDOT.

In an embodiment of the present disclosure, when the first auxiliary electrode and/or the second auxiliary electrode are/is provided, the first auxiliary electrode may be formed before the bar-type LEDs are scattered on the substrate, and the second auxiliary electrode may be formed after the bar-type LEDs are scattered on the substrate.

Figure 10E:
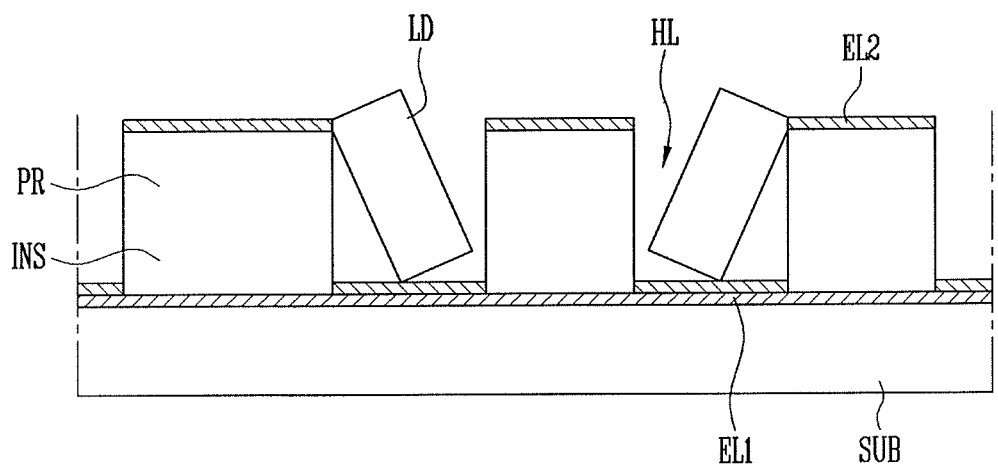

As shown in FIG. 10E, the light emitting device may be fabricated through the above-described processes. As described above, the light emitting device according to the present embodiment may be fabricated by a simple and easy method.

Figure 11:
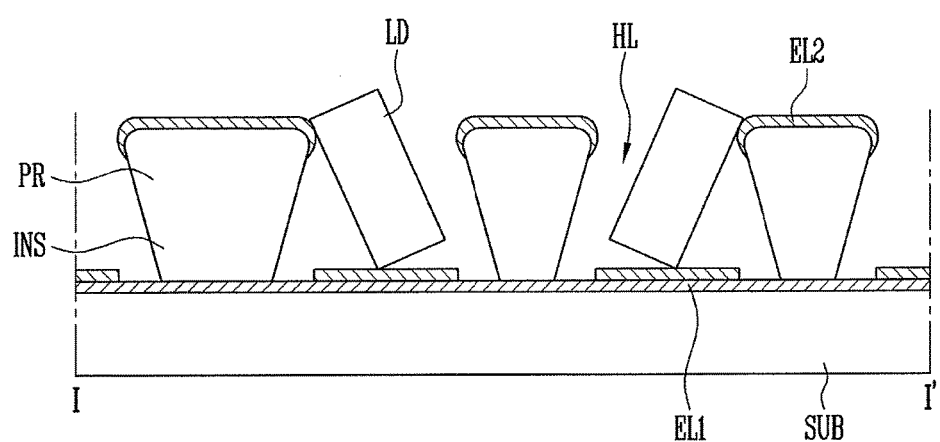
FIG. 11 illustrates an embodiment of a sectional view of the light emitting device corresponding to line I-I' in FIG. 5.

FIG. 11 illustrates another embodiment of a light emitting device, which is a sectional view corresponding to the line I-I' of FIG. 5. Referring to FIG. 11, the light emitting device includes a substrate SUB, a first electrode EL1 on the substrate SUB, an insulating layer INS on the first electrode EL1, the insulating layer INS having holes HL, a second electrode EL2 on the insulating layer INS, and a bar-type LED LD in hole HL.

The first electrode EL1 is provided on the substrate SUB, and the insulating layer INS is provided on the first electrode EL1.

The insulating layer INS includes a plurality of protruding parts PR protruding from the first electrode EL1 and the holes HL between the protruding parts PR. In one embodiment, when assuming that the direction of a top surface of the substrate SUB is an upper direction and the direction of a back surface of the substrate SUB is a lower direction, the width of a section of each of the protruding parts PR in a direction vertical to the top surface of the substrate SUB may be increased as it comes close to the top. For example, the side of each of the protruding parts PR may have a reverse tapered shape. When viewed on a plane, the top of each of the protruding parts PR has a wide area, and the bottom of each of the protruding parts PR has a smaller area than the top of each of the protruding parts PR. For example, if it is assumed that the width of a portion at which the protruding part PR contacts the first electrode EL1 is a first width and the width of a top surface of the protruding part PR is a second width, the second width is greater than the first width.

In the protruding parts PR, the section of each of the protruding parts PR may have the shape of an approximately reverse trapezoid. According to an embodiment, an upper corner portion of the reverse trapezoid may be processed to be round in the protruding part PR. In this case, the second electrode EL2 on the protruding part PR is provided along the rounded top surface of the protruding part PR. Accordingly, the second electrode EL2 is provided on not only the top surface of the protruding part PR but also a portion of the rounded side surface of the protruding part PR. The contact area between the second electrode EL2 and one of first and second ends of the bar-type LED LD is therefore widened. As a result, one of the first or second ends contacts the first electrode EL1, and the other of the first or second ends contacts second electrode EL2.

In the present embodiment, each of the protruding parts PR has a reverse trapezoid shape such that, when viewed on a plane, the top of the protruding part PR has a wide area and the bottom of the protruding part PR has a smaller area than the top of the protruding part PR. The shape of the bottom of each of the protruding parts PR may be different in another embodiment, as long as the top of the protruding part PR has a wider area than the bottom of the protruding part PR.

Figure 12A:
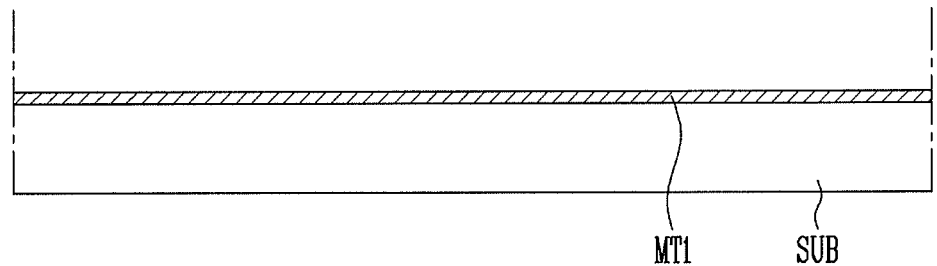
FIGS. 12A-12E illustrate various stages of an embodiment of a method for fabricating the light emitting device in FIG. 11.

FIGS. 12A-12E illustrate various stages in an embodiment of a method for fabricating the light emitting device in FIG. 11. Referring to FIG. 12A, a first conductive layer MT1 is formed on a substrate SUB. A buffer layer may optionally be formed before the first conductive layer MT1 is formed.

Figure 12B:
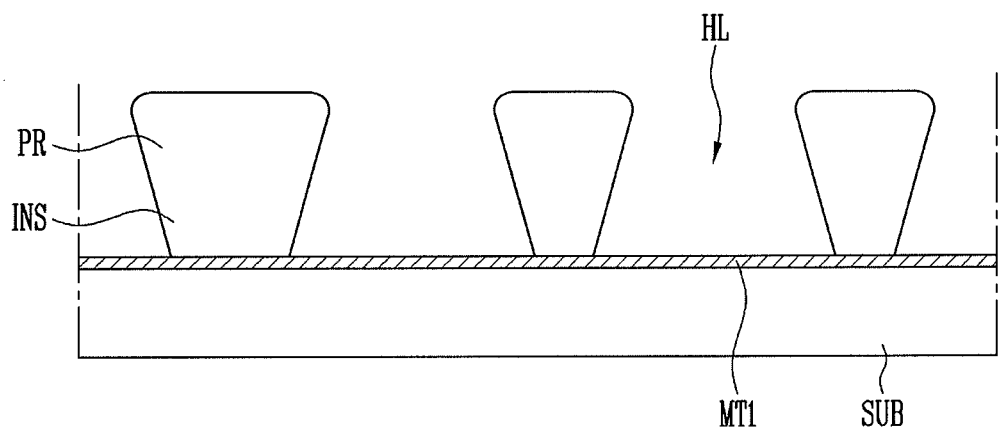

Referring to FIG. 12B, an insulating layer INS having protruding parts PR and holes HL between the protruding parts PR is formed on the first conductive layer MT1. The insulating layer INS is formed to include a plurality of protruding parts PR and a plurality of holes HL. In this case, the insulating layer INS may be formed such that the width of a section of each of the protruding parts PR in a direction vertical to the top surface of the substrate SUB increases as it comes close to the top. The insulating layer INS may be fabricated, for example, by forming a negative type photosensitive organic layer on the first conductive layer MT1 and then exposing and developing the negative type photosensitive organic layer.

The method may include forming a negative type photosensitive organic layer on the substrate SUB and aligning a mask including a shielding part and a transmitting part over the negative type photosensitive organic layer.

If an exposure and development process is performed in the direction of the substrate SUB over the mask, the insulating layer INS having the protruding parts PR may be formed, each of which has a sectional structure of a reverse tapered shape with respect to the surface of the substrate SUB. In the negative type photosensitive organic layer, a portion receiving light remains in the development process. At this time, the surface of the photosensitive organic layer temporarily receives a large amount of light. A portion adjacent to a first electrode EU receives a relatively small amount of light in proportion to the thickness of the photosensitive organic layer due to the transmittance of the photosensitive organic layer. As a result, the photosensitive organic layer well reacts with a light-incident surface. The amount of light incident into the photosensitive organic layer is insufficient at a portion adjacent to the substrate SUB. As such a characteristic is reflected in the development process, the insulating layer INS is formed such that each of the protruding parts PR has a reverse tapered shape, in which the width of the protruding part PR is gradually increased as it approaches from the surface of the substrate SUB to the exposed surface of the photosensitive organic layer. Changing the exposure and development conditions relative to the photosensitive organic layer may form the top of the photosensitive organic layer to have a round shape.

Figure 12C:
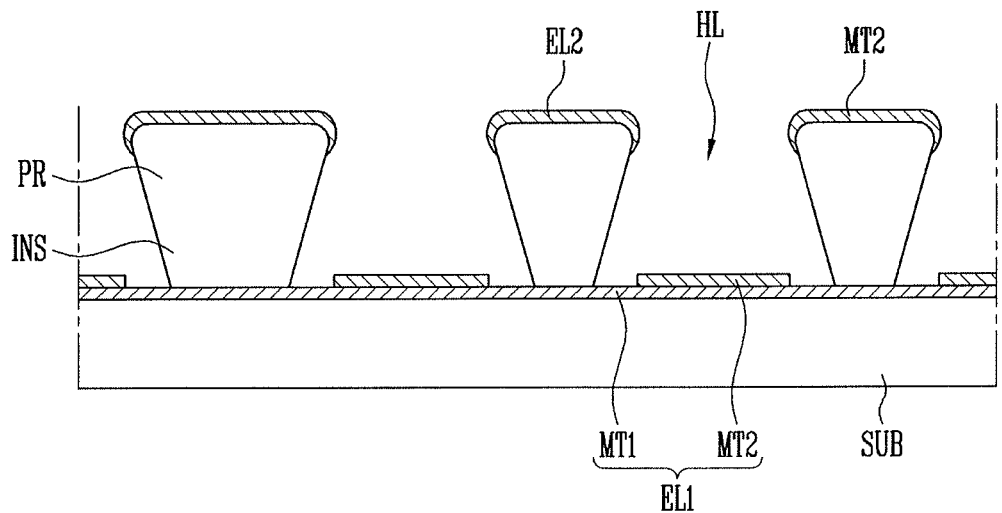

Referring to FIG. 12C, a second conductive layer MT2 is formed on the substrate SUB on which the insulating layer INS is formed. The second conductive layer MT2 may be formed, for example, by coating or depositing the above-described conductive materials.

Accordingly, the second conductive layer MT2 is stacked on the first conductive layer MT1 in a region in which the insulating layer INS is not provided. The first conductive layer MT1 and the second conductive layer MT2 in the region in which the insulating layer INS is not provided become a lower electrode and an upper electrode, respectively, thereby constituting the first electrode EL1. A second electrode EL2 configured as the second conductive layer MT2 is formed on the insulating layer INS in a region in the insulating layer INS is provided.

Figure 12D:
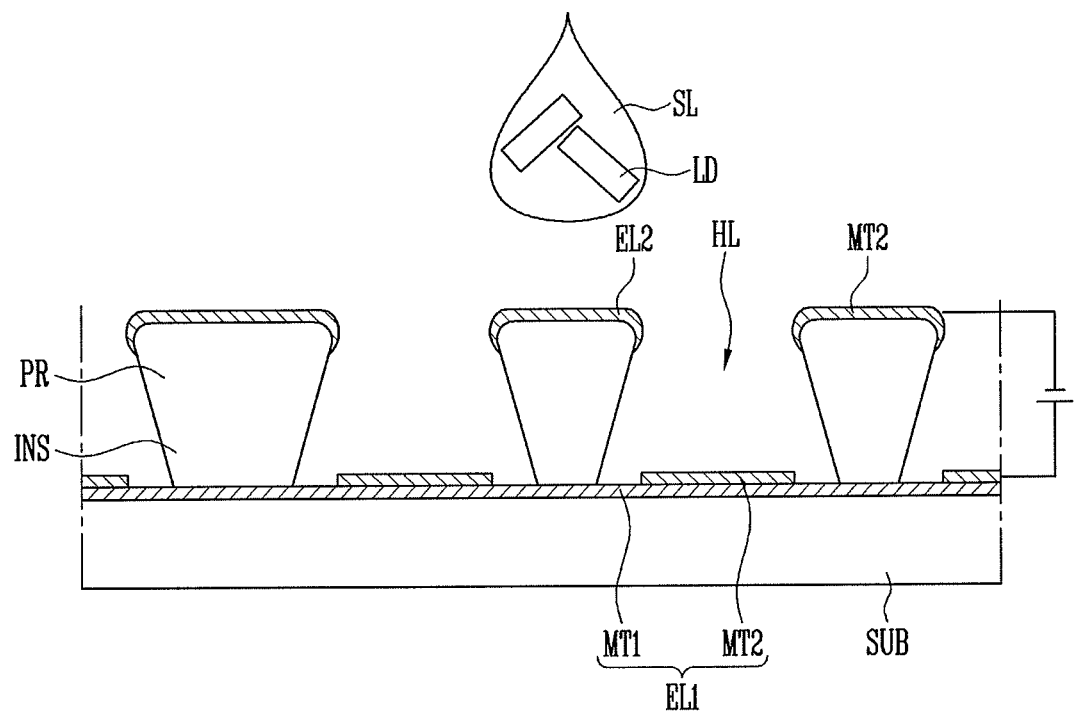

Referring to FIG. 12D, a voltage is applied to the first electrode EL1 and the second electrode EL2. An electric field is formed between the first electrode EL1 and the second electrode EL2. Bar-type LEDs LD are scattered on the substrate SUB in the state in which the electric field is formed between the first electrode EL1 and the second electrode EL2.

Figure 12E:
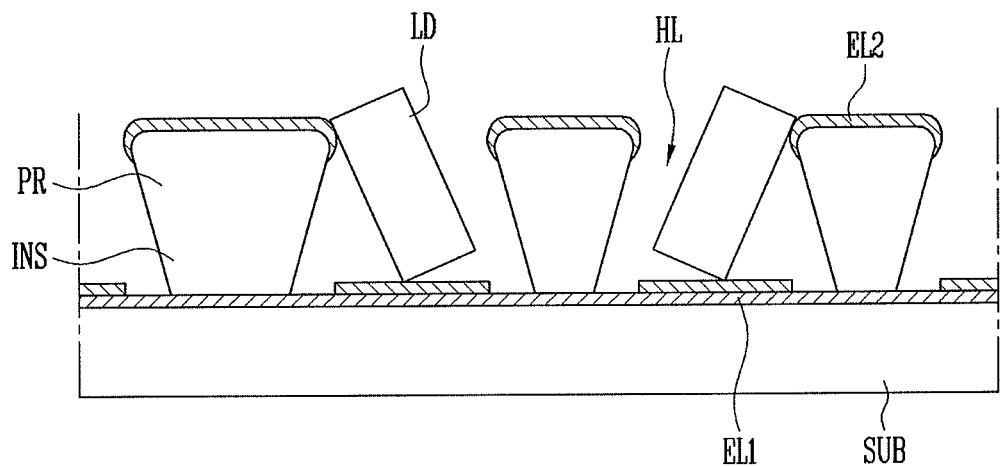

Referring to FIG. 12E, a light emitting device is therefore fabricated through the above-described processes. In an embodiment, the shapes of the protruding parts PR and the first and second electrodes EL1 and EL2 may be different in order to facilitate connection between the bar-type LED LD and first and second electrodes EL1 and EL2.

Figure 13:
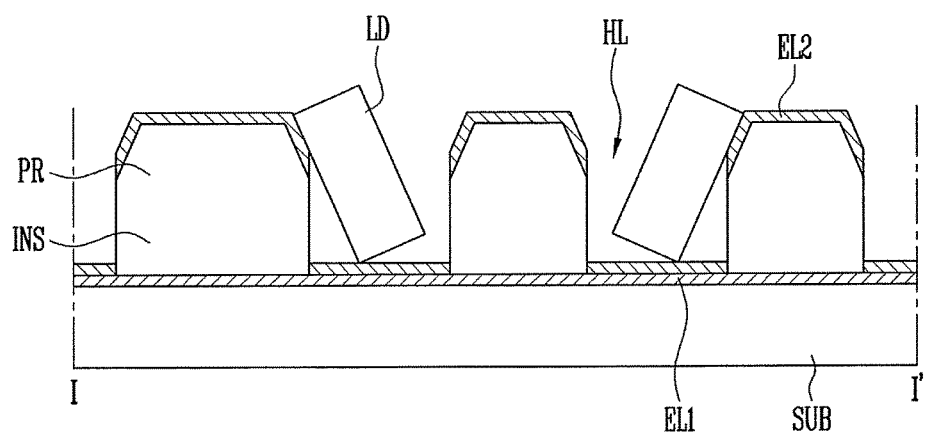
FIG. 13 illustrates an embodiment of a sectional view of the light emitting device corresponding to line I-I' in FIG. 5.

FIG. 13 illustrates another embodiment of a light emitting device corresponding to the line I-I' of FIG. 5. Referring to FIG. 13, the light emitting device includes a substrate SUB, a first electrode EL1 on the substrate SUB, an insulating layer INS on the first electrode EL1, the insulating layer INS having holes HL, a second electrode EL2 on the insulating layer INS, and a bar-type LED LD in the hole HL.

In an embodiment, upper portions of protruding parts PR of the insulating layer INS may be chamfered. The chamfered portions of the protruding parts PR may be inclined at a predetermined angle with respect to a top surface of the substrate SUB. As edges of the protruding parts PR are chamfered, the second electrode EL2 also has a portion inclined at the predetermined angle with the top surface of the substrate SUB. The inclined portion of the second electrode EL2 may increase the contact area between the second electrode EL2 and the bar-type LED LD inclined obliquely at the predetermined angle. This may facilitate electrical connection between the second electrode EL2 and the an end of the bar-type LED LD.

The light emitting device in FIG. 13 may be fabricated by various methods. In an embodiment, the light emitting device may be fabricated by the method of FIGS. 10A-10E using a different mask. For example, in FIG. 10B, the protruding parts PR may be formed through exposure and development using a general mask. However, in the present embodiment, the chamfered protruding parts PR may be formed by performing exposure and development using a halftone mask or a diffraction mask. In one embodiment, the chamfered protruding parts PR may be formed by performing exposure and development using two masks.

In accordance with one or more of the aforementioned embodiment, a light emitting device may be fabricated by a simple and easy method. Also, a light emitting device is provided that emits light toward a front surface and/or a rear surface thereof using a bar-type LED.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
   a substrate;
   a first electrode on the substrate;
   an insulating layer including a plurality of protruding parts protruding from the first electrode and at least one hole between the protruding parts;
   a second electrode on the insulating layer; and a bar-type LED in the at least one hole, wherein the bar-type LED has a first end and a second end in a length direction and wherein one of the first or second ends is connected to the first electrode and the other of the first or second ends is connected to the second electrode.

2. The light emitting device as claimed in claim 1, wherein the length direction of the bar-type LED is vertical or oblique relative to a surface of the substrate.

3. The light emitting device as claimed in claim 1, wherein each of the protruding parts has a reverse tapered shape.

4. The light emitting device as claimed in claim 1, wherein a height of each of the protruding parts is equal to or less than a length of the bar-type LED.

5. The light emitting device as claimed in claim 1, further comprising a plurality of holes between the protruding parts.

6. The light emitting device as claimed in claim 5, wherein the holes are arranged radially.

7. The light emitting device as claimed in claim 5, wherein the holes have a stripe shape.

8. The light emitting device as claimed in claim 7, wherein the holes are arranged in parallel to each other.

9. The light emitting device as claimed in claim 5, wherein a width of each of the holes is less than a length of the bar-type LED.

10. The light emitting device as claimed in claim 1, wherein a shape of the second electrode is substantially equal to a shape of the insulating layer.

11. The light emitting device as claimed in claim 1, further comprising:
    an auxiliary electrode between one of the first or second ends and the first electrode or between one of the first or second ends and the second electrode.

12. The light emitting device as claimed in claim 1, wherein the first electrode and the second electrode are at different heights from a top surface of the substrate.

* * * * *